US009234129B2

(12) United States Patent
Lee et al.

(10) Patent No.: US 9,234,129 B2
(45) Date of Patent: *Jan. 12, 2016

(54) SURFACE-MODIFIED QUANTUM DOT LUMINOPHORES

(71) Applicants: SEOUL SEMICONDUCTOR CO., LTD., Ansan-si (KR); LITEC-LP GmbH, Greifswald (DE)

(72) Inventors: Chung Hoon Lee, Ansan-si (KR); Walter Tews, Greifswald (DE); Gundula Roth, Levenhagen (DE); Detlef Starick, Greifswald (DE)

(73) Assignees: Seoul Semiconductor Co., Ltd., Ansan-si (KR); LITEC-LP GMBH, Greifswald (DE)

( * ) Notice: Subject to any disclaimer, the term of this patent is extended or adjusted under 35 U.S.C. 154(b) by 155 days.

This patent is subject to a terminal disclaimer.

(21) Appl. No.: 14/076,738

(22) Filed: Nov. 11, 2013

(65) Prior Publication Data
US 2014/0061503 A1 Mar. 6, 2014

Related U.S. Application Data

(63) Continuation-in-part of application No. 13/184,271, filed on Jul. 15, 2011, now Pat. No. 8,945,421.

(30) Foreign Application Priority Data

Aug. 14, 2010 (DE) .................. 10 2010 034 322

(51) Int. Cl.
C09K 11/02 (2006.01)
C09K 11/64 (2006.01)
C09K 11/56 (2006.01)
C09K 11/77 (2006.01)
H01L 33/50 (2010.01)

(52) U.S. Cl.
CPC ............... C09K 11/02 (2013.01); C09K 11/025 (2013.01); C09K 11/562 (2013.01); C09K 11/64 (2013.01); C09K 11/7734 (2013.01); H01L 33/502 (2013.01); H01L 33/501 (2013.01); Y10S 977/774 (2013.01); Y10S 977/813 (2013.01); Y10S 977/816 (2013.01); Y10S 977/818 (2013.01); Y10S 977/819 (2013.01); Y10S 977/824 (2013.01); Y10S 977/83 (2013.01); Y10S 977/834 (2013.01)

(58) Field of Classification Search
CPC . C09K 11/02; Y10S 977/774; Y10S 977/813; Y10S 977/824; Y10S 977/818; Y10S 977/819; Y10S 977/816; Y10S 977/83; Y10S 977/834
See application file for complete search history.

(56) References Cited

U.S. PATENT DOCUMENTS

| 5,792,509 | A | 8/1998 | Lin et al. |
| 6,489,716 | B1 | 12/2002 | Tews et al. |
| 7,065,285 | B2 * | 6/2006 | Chen et al. ............ 385/141 |
| 7,161,298 | B2 | 1/2007 | Kawamura et al. |
| 7,629,620 | B2 | 12/2009 | Maeda et al. |
| 7,922,937 | B2 | 4/2011 | Li et al. |
| 8,581,286 | B2 | 11/2013 | Lee et al. |
| 8,734,762 | B2 * | 5/2014 | Chung et al. ............ 424/9.6 |
| 2003/0173540 | A1 | 9/2003 | Mortz et al. |
| 2004/0239247 | A1 | 12/2004 | Kawamura et al. |
| 2005/0227077 | A1 | 10/2005 | Sugiyama |
| 2007/0001585 | A1 | 1/2007 | Hasegawa et al. |
| 2007/0125984 | A1 | 6/2007 | Tian et al. |
| 2007/0217755 | A1 | 9/2007 | Chen et al. |
| 2007/0232181 | A1 | 10/2007 | Okumura et al. |
| 2008/0023721 | A1 | 1/2008 | Lee et al. |
| 2008/0135862 | A1 | 6/2008 | Maeda et al. |
| 2008/0230795 | A1 | 9/2008 | Dias |
| 2009/0134775 | A1 | 5/2009 | Watanabe et al. |
| 2009/0218581 | A1 | 9/2009 | Schmidt et al. |
| 2009/0289546 | A1 | 11/2009 | Igarashi et al. |
| 2010/0142189 | A1 | 6/2010 | Hong et al. |
| 2010/0207132 | A1 | 8/2010 | Lee et al. |
| 2011/0068321 | A1 | 3/2011 | Pickett et al. |
| 2011/0101387 | A1 | 5/2011 | Kinomoto |
| 2012/0037850 | A1 | 2/2012 | Lee et al. |
| 2012/0193579 | A1 | 8/2012 | Kempfert et al. |
| 2012/0299032 | A1 | 11/2012 | Li |
| 2014/0061503 | A1 | 3/2014 | Lee et al. |

FOREIGN PATENT DOCUMENTS

| CN | 10-1072844 | 11/2007 |
| CN | 101586025 | 11/2009 |
| EP | 550937 | 1/1992 |
| EP | 877070 | 11/1998 |

(Continued)

OTHER PUBLICATIONS

The extended European Search Report Issued on Sep. 22, 2014 in European Patent Application No. 11818314.

(Continued)

Primary Examiner — Carol M Koslow
(74) Attorney, Agent, or Firm — H.C. Park & Associates, PLC

(57) ABSTRACT

A surface-modified quantum dot luminophore includes a quantum dot luminophore and a coating includes a fluorinated coating including a fluorinated inorganic agent, a fluorinated organic agent, or a combination of fluorinated inorganic and organic agents, the fluorinated coating generating hydrophobic surface sites and the coating is disposed on the surface of the silicate luminophore.

6 Claims, 9 Drawing Sheets

(56) References Cited

FOREIGN PATENT DOCUMENTS

| | | | |
|---|---|---|---|
| EP | 1124913 | | 9/2008 |
| EP | 2554628 | | 2/2013 |
| JP | 52-22584 | | 2/1977 |
| JP | 52-156188 | | 12/1977 |
| JP | 10-125240 | | 5/1998 |
| JP | H10-125240 | | 5/1998 |
| JP | 2002-069442 | | 3/2002 |
| JP | 2002-329895 | | 11/2002 |
| JP | 2003-041247 | | 2/2003 |
| JP | 2004-143408 | | 5/2004 |
| JP | 2005-003436 | | 1/2005 |
| JP | 2005-068343 | | 3/2005 |
| JP | 2005-187797 | | 7/2005 |
| JP | 2006-036943 | | 2/2006 |
| JP | 2006-232949 | | 9/2006 |
| JP | 2006-286672 | | 10/2006 |
| JP | 2007-186674 | | 7/2007 |
| JP | 2007-302799 | | 11/2007 |
| JP | 2008-050379 | | 3/2008 |
| JP | 2009-013186 | | 1/2009 |
| JP | 2009-055043 | | 3/2009 |
| JP | 2009-132902 | | 6/2009 |
| JP | 2009-526089 | | 7/2009 |
| JP | 2009-280664 | | 12/2009 |
| JP | 2011-111506 | | 6/2011 |
| KR | 10-2009-0023092 | | 3/2009 |
| KR | 10-2009-0040097 | | 4/2009 |
| WO | 2006/061747 | | 6/2006 |
| WO | WO 2009/051337 | * | 4/2009 |
| WO | 2010/060437 | | 6/2010 |
| WO | 2011/045359 | | 4/2011 |
| WO | WO 2012/134629 | * | 10/2012 |

OTHER PUBLICATIONS

The extended European Search Report Issued on Sep. 22, 2014 in European Patent Application No. 11818337.

The First Office Action issued on Feb. 8, 2014 in Chinese Patent Application No. 201180039682.1.

The Second Office Action issued on Sep. 4, 2014 in Chinese Patent Application No. 201180039682.1.

TimeDomain CVD, Inc. (author unavailable), "TEOS/Oxygen Thermal CVD", http://www.timedomaincvd.com/CVD_Fundamentals/films/TEOS_O2_thermal.html, retrieved on Oct. 13, 2014.

Wang, et al., "FTIR Analyses of SiOF Thin Film with Low Dielectric Constant", Research & Progress of SSE, Nov. 2001, vol. 21, No. 4, pp. 477-482.

Li et al, "An Optical Emission Spectroscopy Study of the Deposited SiO2 Film with RF Cold Plasma at Atmospheric-pressure", The Journal of Light Scattering, Dec. 2006, vol. 18, No. 4, pp. 360-364.

Non-Final Office Action issued on Jun. 3, 2014 in U.S. Appl. No. 13/184,271.

Notice of allowance issued on Sep. 22, 2014 in U.S. Appl. No. 13/184,271.

Final Office Action issued on Nov. 22, 2013 in U.S. Appl. No. 13/184,271.

International Search Report issued on Mar. 23, 2012 in International Application No. PCT/KR2011/005842.

Written Opinion issued on Mar. 23, 2012 in International Application No. PCT/KR2011/005842.

International Search Report issued on Mar. 26, 2012 in International Application No. PCT/KR2011/005607.

Written Opinion issued on Mar. 26, 2012 in International Application No. PCT/KR2011/005607.

Non-Final Office Action issued on Feb. 4, 2013 in U.S. Appl. No. 13/209,733.

Non-Final Office Action issued on Apr. 25, 2013 in U.S. Appl. No. 13/184,271.

Notice of Allowance issued on Jul. 5, 2013 in U.S. Appl. No. 13/209,733.

Non-Final Office Action dated Feb. 10, 2015, in U.S. Appl. No. 14/076,642.

* cited by examiner

SURFACE-MODIFIED QUANTUM DOT LUMINOPHORES

CROSS REFERENCE TO RELATED APPLICATIONS

This application is a continuation-in-part of U.S. patent application Ser. No. 13/184,271, filed on Jul. 15, 2011, now U.S. Pat. No. 8,945,421, and claims priority from and the benefit of German Patent Application No. 10 2010 034 322.6, filed on Aug. 14, 2010, which are hereby incorporated by reference for all purposes as if fully set forth herein.

BACKGROUND OF THE INVENTION

1. Field of the Invention

Exemplary embodiments of the present invention relate to inorganic luminophores based on doped alkaline earth metal silicate compounds and quantum dot semiconductor compounds which are capable of converting high-energy primary radiation, i.e., for example, ultraviolet (UV) radiation or blue light, to a longer-wavelength secondary radiation within the visible spectral region, which can be used as radiation converters in light-emitting devices such as color or white-light emitting light emitting diodes (LEDs). Exemplary embodiments of the present invention also relate to silicatic inorganic luminophores and quantum dot luminophores which may have improved stability to air humidity and other environmental factors, and increased operational lifetime.

2. Discussion of the Background

Alkaline earth metal silicate luminophores, which include the europium-doped alkaline earth metal orthosilicates, the corresponding oxyorthosilicates and the disilicates of the $Ba(Sr)_3MgSi_2O_8$:Eu form, have been known for some time. An overview of the classification of the alkaline earth metal silicate compounds is documented by Hollemann-Wiberg, "Lehrbuch der Anorganischen Chemie" Inorganic Chemistry, 102 edition, (Walter de Gruyter & Co., Berlin, 2007). The preparation and the essential luminescence properties thereof have been described in detail in various patents and publications, for example: U.S. Pat. No. 6,489,716, issued to Tews, et al.; EP Appl. Pub. No. 0550937, applied for by Ouwerkerk, et al.; EP Appl. Pub. No. 0877070, applied for by Hase, et al.; and by W. M. Yen et al., "Phosphor Handbook", $2^{nd}$ Ed., CRC Press (2007). These publications indicate that such luminophores have high quantum and radiation yields for the conversion of high-energy radiation to visible light, and numerous representatives of this luminophore class, due to these properties, may be used in products for lighting, illumination, and display technology.

However, the luminophores based on the alkaline earth metal silicates also have various disadvantageous properties. Some of the disadvantages include a comparatively low radiation stability and high sensitivity of the luminophores to water, air humidity, and other environmental factors. The sensitivity depends on the particular composition of the luminophore, structural conditions, and the nature of activator ions of the luminophores. For some of the current applications of wavelength-conversion luminophores, these properties may be problematic. In view of the high lifetime demands, this may apply to LED applications. One known solution is to use suitable technologies and materials to generate (on the surface of pulverulent inorganic luminophores) barrier layers for reducing the influence of water vapour.

These processes may include encapsulation with organic polymers, coating with nanoscale oxides such as $SiO_2$ or $Al_2O_3$, or chemical vapour deposition (CVD) of such oxides. However, in relation to silicatic luminophores, the protection achievable may be insufficient to improve the lifetime of corresponding LED lamps to the desired degree. Furthermore, in the case of coated luminophores, it may be necessary to accept losses in brightness, shifts in the color location, and other quality losses. Processes for microencapsulation of the luminophore particles by means of gas phase processes may be inconvenient and costly.

Quantum dots also can be used as luminophores and their wavelengths become shorter as their sizes become smaller. Quantum dots are very reactive due to their small size, and thus, quantum dots have also a comparatively low radiation stability and high sensitivity to water, air humidity, and other environmental factors.

SUMMARY OF THE INVENTION

Exemplary embodiments of the present invention provide silicate or quantum dot luminophores that may provide moisture stability, stability to radiation and other environmental influences, and improved operational lifetime.

Exemplary embodiments of the present invention also provide luminophores that have been subjected to a surface treatment with fluorinated inorganic or organic agents.

Exemplary embodiments of the present invention also provide detectable fixing of finely dispersed fluorides or fluorine compounds on the luminophore surface or the formation of surface networks of such compounds which are capable of making the luminophore surfaces hydrophobic and may cure surface defects.

Additional features of the invention will be set forth in the description which follows, and in part will be apparent from the description, or may be learned by practice of the invention.

An exemplary embodiment of the present invention discloses a surface-modified silicate luminophore including (a) a silicate luminophore and a coating including at least one of a fluorinated coating including a fluorinated inorganic agent, a fluorinated organic agent, or a combination of a fluorinated inorganic agent and a fluorinated organic agent, the fluorinated coating generating hydrophobic surface sites, and (b) a combination of the fluorinated coating and at least one moisture barrier layer, the moisture barrier layer including MgO, $Al_2O_3$, $Ln_2O_3$, $Y_2O_3$, $La_2O_3$, $Gd_2O_3$, $Lu_2O_3$, and $SiO_2$, or corresponding precursors.

An exemplary embodiment of the present invention discloses a surface-modified quantum dot (QD) luminophore including a QD luminophore and a coating including at least one of a fluorinated coating including a fluorinated inorganic agent, a fluorinated organic agent, or a combination of a fluorinated inorganic agent and a fluorinated organic agent, the fluorinated coating generating hydrophobic surface sites.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
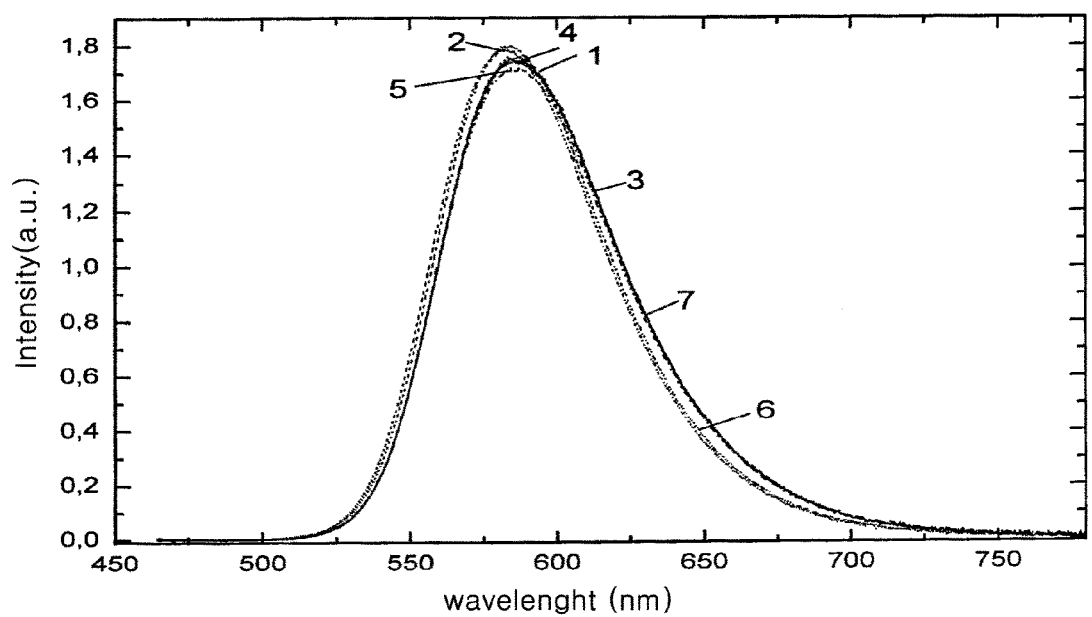
FIG. 1a is emission spectra of a reference material $Sr_{2.9}Ba_{0.01}Ca_{0.05}Eu_{0.04}SiO_5$, a commercial $Sr_3SiO_5$:Eu luminophore, and oxyorthosilicate luminophores F-103, F-202, F-202T, F-320 and F-TS-600 according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

On excitation with high-energy UV radiation, blue light, electron beams, X-rays or gamma rays and, depending on their specific chemical composition and the nature of an activator, the luminophores according to exemplary embodiments of the present invention may emit visible light and infrared radiation with high radiation yields and significantly improved stability to $H_2O$, air humidity, and other environmental factors compared to the prior art. For this reason, they may be used in long-life industrial products, for example in cathode ray tubes and other image-generating systems (scanning laser beam systems) in X-ray image converters, high-performance light sources, LEDs of all colors for interior and exterior illumination, backlighting of LCD displays, solar cells, greenhouse films, and glasses as radiation converters.

Luminophores according to exemplary embodiments of the present invention, including surface-modified silicate luminophores, may be characterized in that the surface thereof has a coating of fluorinated inorganic or organic agents for generation of hydrophobic surface sites, or of a combination of the fluorinated coating with one or more moisture barrier layers composed of layer-forming materials such as the oxides MgO, $Al_2O_3$, $Ln_2O_3$ (wherein Ln=Y, La, Gd, or Lu) and $SiO_2$, or the corresponding precursors, or sol-gel technologies.

Luminophores, including surface-modified silicate luminophores, according to exemplary embodiments of the present invention may include pulverulent alkaline earth metal silicate luminophores. The surface-modified silicate luminophores may have the general formula:

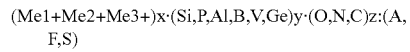

(Me1+Me2+Me3+)x·(Si,P,Al,B,V,Ge)y·(O,N,C)z:(A,F,S)

where A is an activator selected from the group of the lanthanoids or manganese; F represents the fluorinated coating that comprises surface fixed and optionally cross-linked fluorine ions, or surface fixed or cross-linked fluorine compounds; and S characterizes an optional additional coating with non-fluorinated layer-forming materials as the moisture barrier layer. Me1+ is a monovalent metal, Me2+ is a divalent metal and Me3+ is a trivalent metal selected from group III of the Periodic Table or from the lanthanoids. Some of the silicon may be replaced by P, Al, B, V, or Ge. N and C may be incorporated into the crystal as anions. The coefficients x, y, and z may have the following ranges: $0<x<5$, $0<y<12$, and $0<z<24$.

According to exemplary embodiments of the present invention, which may optimize luminescence properties and stability performance, some of the alkaline earth metal ions in the surface-modified silicate luminophores may be replaced by further divalent ions, for example Mg, Zn, or, with implementation of suitable measures for balancing the charge, monovalent or trivalent cations from the group of alkali metals or of the rare earths. Further, P, Al, B, V, or Ge can be incorporated into an anion sublattice of the surface-modified silicate luminophores replacing some of the silicon. N and C may be incorporated into the crystal as anions.

According to exemplary embodiments of the present invention, the alkaline earth metal silicate luminophores may be fluorinated using fluorine-functionalized organosilanes of the $Si(OR)_3X$ form where $R=CH_3, C_2H_5, \ldots$, and X=a F-functionalized organic ligand, and controlled hydrolysis and condensation may achieve the formation of a fluorinated barrier layer on a silicatic luminophore matrix, which may be a barrier and may also have hydrophobic properties.

The surface-modified silicate luminophores according to exemplary embodiments of the present invention, may be characterized by the general formula:

$$Sr_{3-x-y-z}Ca_xBa_ySiO_5:Eu_z,F,S$$

wherein $0 \leq x \leq 2$, $0 \leq y \leq 2$ and $0 < z < 0.5$. The surface-modified silicate luminophores according to exemplary embodiments of the present invention, may also be characterized by the formula:

$$Sr_{3-x-y-z}Ca_xBa_ySiO_5:Eu_z,F,S$$

wherein $0 \leq x \leq 0.05$, $0 \leq y \leq 0.5$ and $0 < z < 0.25$.

Luminophore powders used as the basis for the preparation of the surface-modified luminophores according to exemplary embodiments of the present invention may be synthesized by multistage high-temperature solid-state reactions at temperatures above 1000° C. between the alkaline earth metal carbonates that may be used as the starting material or the corresponding metal oxides and $SiO_2$. Additionally, mineralization additives (e.g. $NH_4Cl$, $NH_4F$, or alkali metal or alkaline earth metal halides or halides of the trivalent metals) may be added to the reaction mixture to promote reactivity and to control the particle size distribution of the resulting luminophores. Depending on the specific selection of the stoichiometric ratios, it may be possible to produce the desired compositions of the doped alkaline earth metal silicate luminophores, more particularly the corresponding ortho- and oxyortho-silicate luminophores.

Accordingly, the calculated amounts of the starting materials are mixed vigorously and then subjected to a multistage calcination process in an inert or reducing atmosphere within the desired temperature range. For the purpose of optimizing the luminophore properties, the main calcination process may optionally also have several calcination stages within different temperature ranges. After the calcination process has ended, the samples are cooled to room temperature and subjected to suitable aftertreatment processes that are directed, for example, to the elimination of flux residues, to the minimization of surface defects, or else to the tine adjustment of the particle size distribution. Instead of the silicon oxide, it is alternatively also possible to use silicon nitride ($Si_3N_4$) or other silicon-containing precursors as reactants for the reaction with the alkaline earth metal compounds used. The synthesis of the polycrystalline luminophore powders used for the production of exemplary embodiments of the luminophores is not restricted to the preparation processes described above.

For the fluorination of the surfaces of the pulverulent alkaline earth metal silicate luminophores according to the present invention, different inorganic fluorine compounds may be used such as alkali metal fluorides (e.g. LiF, NaF, KF) alkaline earth metal fluorides ($MgF_2$, $CaF_2$, $SrF_2$, $BaF_2$), $AlF_3$ and fluorides of the rare earths (e.g. $YF_3$, $LaF_3$ or $GdF_3$), $NH_4F$ and $NH_4HF_2$, and also other inorganic or organic fluorine compounds (e.g. fluoride-containing amines). The materials selected are mixed with the silicatic luminophore powders, in which case aqueous suspensions may be employed. The required proportions of the fluorinating agents added depend on the solubility of the compounds and on the reaction conditions (pH, temperature, intensity of mixing, residence time, etc.) and may be determined experimentally.

After the surface treatment has ended, the fluorinated luminophores are removed from the suspension, and may be washed with suitable solvents and then dried at temperatures between 80° C. and 200° C. After cooling and screening, they are in a form ready for use.

For the achievement of optimal luminophore properties, depending on the specific composition of the inventive luminophores, on the type and amount of the fluorinating agents used, and further factors, to subject the luminophores produced in accordance with the invention, additionally or instead of the drying process, to a thermal aftertreatment (heat treatment) within a temperature range from 300° C. to 600° C. in a reducing atmosphere. Detailed information regarding the production of the luminophores according to exemplary embodiments of the present invention is given hereinafter by several working examples.

Working Example A1

Working Example A1 describes the preparation of a luminophore provided with a fluorinated surface layer and having the base lattice composition $Sr_{2.9}Ba_{0.01}Ca_{0.05}SiO_5:Eu_{0.04}$ according to an exemplary embodiment of the present invention, which is described as sample F-103 together with its optical data in Table 1, and the emission spectrum that is designated as "3" in FIG. 1a.

Table 1 contains optical and moisture stability data of europium-activated strontium oxyorthosilicate luminophore samples which have been treated with different amounts of $NH_4F$. To synthesize the corresponding luminophore matrix, the stoichiometric amounts of $SrCO_3$, $BaCO_3$, $CaCO_3$, $Eu_2O_3$, and $SiO_2$ and 0.2 mol of $NH_4Cl$ are mixed vigorously and then subjected, in corundum crucibles, to a 5-hour calcination process at 1400° C. in an $N_2/H_2$ atmosphere containing 2% hydrogen. After the calcination process has ended, the calcinated material is homogenized, ground and washed with $H_2O$, Subsequently, 100 g of the dried and screened luminophore are introduced together with 1.1 g of $NH_4F$, 200 g of glass beads and 1 liter of water into a suitable plastic vessel and mixed vigorously on a jar mill at low speed for 30 minutes. After a settling time of several minutes, the supernatant is first decanted and then filtered with suction through a Büchner funnel. This is followed by drying and screening of the end product.

Working Example A2

To prepare the luminophore containing sample F-202 according to an exemplary embodiment of the present invention, the optical data of which are specified in Table 2 and the emission spectrum of which is designated as "4" in FIG. 1a, 100 g of the luminophore matrix described in Working Example A1 are mixed with 2.474 g of $NH_4HF_2$. Table 2 contains optical and moisture stability data of europium-activated strontium oxyorthcsilicate luminophore samples which have been treated with different amounts of $NH_4HF_2$. In this case, the fluorinated surface layer is applied by wet-chemical precipitation by taking the mixture in 1 L of deionized water and 400 g of glass beads on a roll mill. Treatment for one hour is followed by the removal of the coated luminophore from the solution and an after-treatment analogous to Working Example A1.

Working Example A3

Here, 30 g of the luminophore produced according to Working Example A2 are heat treated in a corundum crucible at 400° C. in an $N_2/H_2$ atmosphere containing 35% hydrogen for 60 minutes. After cooling, the sample F-202T, the optical data of which are specified in Table 2 and the emission spectrum of which is designated as "5" in FIG. 1a, is homogenized by screening to produce an exemplary embodiment of the present invention.

Working Example A4

An oxyorthosilicate luminophore with a base lattice composition $Sr_{2.948}Ba_{0.01}Cu_{0.002}SiO_5:Eu_{0.04}$ according to an exemplary embodiment of the present invention is synthesized in the solid state according to Working Example A1 and coated with an $SiO_2$ network using precursor material tetraethoxysilane (TEOS). For this purpose, 50 g of the luminophore are mixed with 500 mL of a solution of 1 L of ethanol, 18.2 g of TEOS and 100 mL of 32% aqueous ammonia, and stirred in a reaction vessel for 2 hours. Thereafter, the coated luminophore is filtered with suction, washed with ethanol, and dried at 160° C. for 24 hours.

After this preparative surface treatment, the luminophore is subjected, as in Working Example A1, to fluorination by $NH_4F$ as the fluorinating agent. For this purpose, 80 g of the precoated luminophore is reacted with 1.98 g of $NH_4F$ under the conditions of Working Example A1. The luminophore according to the present exemplary embodiment is thus produced, in the form of sample F-TS-600. The optical data of which are described in Table 6, and the emission spectrum of which is designated as "7" in FIG. 1a, like the luminophore described in Working Examples A1, A2, and A3, and may have a significantly improved moisture resistance compared to conventional oxyorthosilicate luminophores and the same base lattice composition as the uncoated base luminophores. The performance characteristics of these luminophores according to the exemplary embodiments of the present invention are compiled in Tables 1, 2 and 6.

Working Example B1

For the production of the luminophore according to an exemplary embodiment of the present invention in the form of sample F-320, a base lattice of the composition $Sr_{2.9485}Ba_{0.01}Cu_{0.0015}SiO_5:Eu_{0.04}$ is synthesized. For this purpose, the stoichiometric amounts of $SrCO_3$, $BaCO_3$, CuO, $Eu_2O_3$, 65 g of $SiO_2$ and 0.3 mol of $NH_4Cl$ are mixed, introduced into suitable calcining crucibles and calcined in a high-temperature furnace for a period of 24 hours. The calcination program has two main calcination zones at 1200° C. and 1350° C. for 3 hours at each temperature. During the first calcination phase, calcination is effected under forming gas with hydrogen concentration 5%, and the hydrogen concentration is increased to 20% in the subsequent second phase of calcination.

The cooling, washing and homogenization of the matrix material are followed by the fluorination of the luminophore surface. To this end, the fluorinating agent used is aluminium fluoride $AlF_3$ instead of the $NH_4F$ or the $NH_4HF_2$. For interaction with the surface of the luminophore particles, 1.2 g of $AlF_3$ are introduced into 1 L of $H_2O$ at 60° C. and the mixture is stirred vigorously for 1 hour. Subsequently, 100 g of the luminophore matrix synthesized are added to the suspension. The reaction time may be 60 minutes. The coated luminophore in the form of sample F-320 is after-treated similarly to Working Examples A1, A2, A3, and A4. The optical data are shown in Table 3, and the emission spectrum thereof is designated as "6" in FIG. 1a. Table 3 contains optical and stability data of further fluorinated $Eu^{2+}$-doped strontium oxyorthosilicate luminophores.

Working Example C1

The working examples which follow relate to alkaline earth metal orthosilicate luminophores coated in accordance with exemplary embodiments of the present invention and having a composition of $Sr_{0.876}Ba_{1.024}SiO_4:Eu_{0.1}$. In the present exemplary embodiment, the base material is produced by a high-temperature solid-state reaction wherein the starting mixture comprises stoichiometric amounts of $SrCO_3$, $BaCO_3$, $Eu_2O_3$, $SiO_2$, and 0.2 mol of $NH_4Cl$.

The calcination process includes heating the crucible filled with the starting mixture to 1275° C. in a nitrogen atmosphere, maintaining this temperature over a period of 10 hours and subsequently cooling to room temperature. On attainment of the high-temperature ramp, 20% hydrogen is added to the protective gas. After cooling, the resulting materials are subjected to washing to remove flux residues, and then dried and screened.

For fluorination of the base material, 150 g of the luminophore powder and 4.268 g of $NH_4F$ are suspended in 3 L of $H_2O$ and stirred over a period of 2 hours. After the coating procedure has ended, the fluorinated luminophore is filtered with suction to give sample F-401, washed with ethanol on the suction filter, and dried at 130° C. for 24 hours. The optical data of sample F-401 are shown in Table 4, and F-401's emission spectrum is designated as "3" in FIG. 1b. Table 4 contains optical and stability data of fluorinated green-wavelength emitting alkaline earth metal orthosilicate luminophores that have additionally been coated with $SiO_2$.

In a further step, the luminophore according to the present exemplary embodiment in the form of sample F-401 may be provided with an $SiO_2$ coating. For this purpose, 50 g of the fluorinated $Sr_{0.876}Ba_{1.024}SiO_4:Eu_{0.1}$ luminophore powder are added to 500 mL of TEOS solution consisting of 1 L of ethanol, 25 g of TEOS and 150 mL of 32% aqueous ammonia, which has been prepared 24 hours before use. After a stifling time of 5 hours, reaction is terminated. The surface-coated luminophore in the form of sample F-401TS is filtered with suction, washed with ethanol again, and dried. The optical data of the sample F-401TS are specified in Table 4, F-401TS's emission spectrum is designated as "4" in FIG. 1b.

Figure 1B:
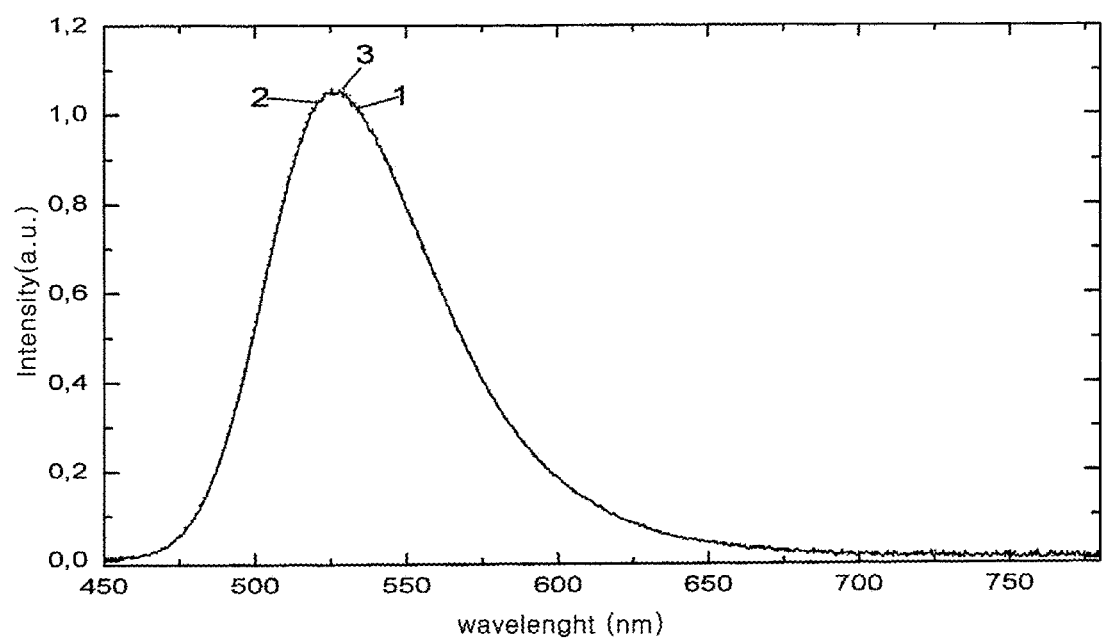
FIG. 1b is emission spectra of reference material $Sr_{0.876}Ba_{1.024}Eu_{0.1}SiO_4$ and two alkaline earth metal orthosilicate luminophores F-401 and F-401TS according to exemplary embodiments of the present invention.

The emission spectra of the fluorinated luminophores of different matrix composition compared to the luminophores untreated in each case are described in FIG. 1a and FIG. 1b, which show that the luminescence intensities of the luminophores with fluorinated surface structure according to the exemplary embodiments of the present invention differ slightly from those of the reference material. This is also confirmed by the luminescence data of the luminophore samples according to exemplary embodiments compiled in Table 1, Table 2, Table 3, Table 4, Table 5, Table 6, and Table 7 while somewhat lower luminescence intensities were measured in some cases for fluorinated and optionally additionally $SiO_2$ coated samples. There are also examples in the tables referred to for surface treatment leading to a slight increase in luminescence efficiency. The latter effect may be attributed to the somewhat better emission of light in the case of the coated materials.

Figure 2A:
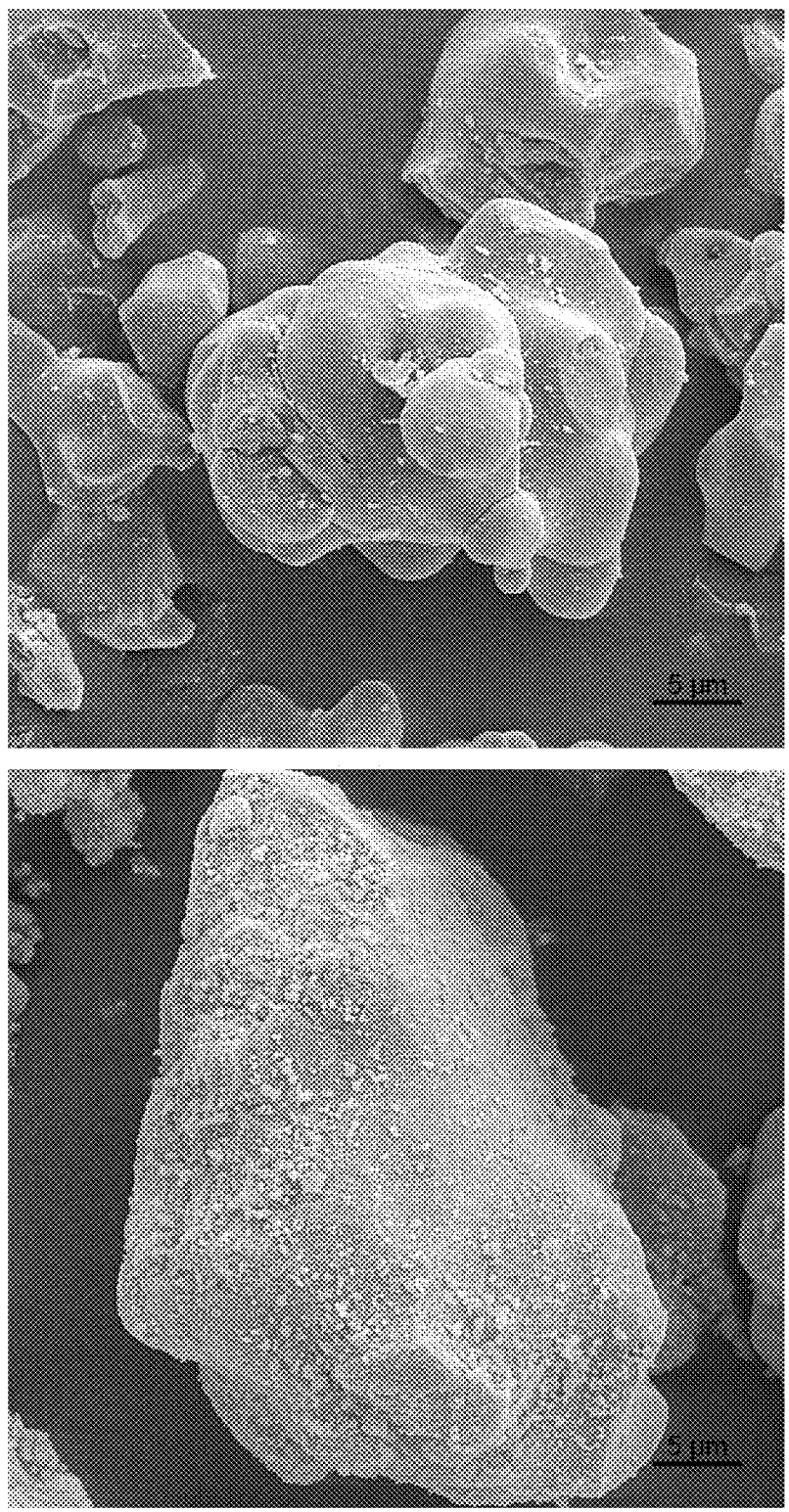
FIG. 2a is electron micrographs of non-fluorinated and fluorinated alkaline earth metal oxyorthosilicate luminophores, showing untreated particles of the luminophore $Sr_{2.9}Ba_{0.01}Ca_{0.05}SiO$ on the left and fluorinated particles of the luminophore F-202 according to an exemplary embodiment of the present invention on the right.
Figure 2B:
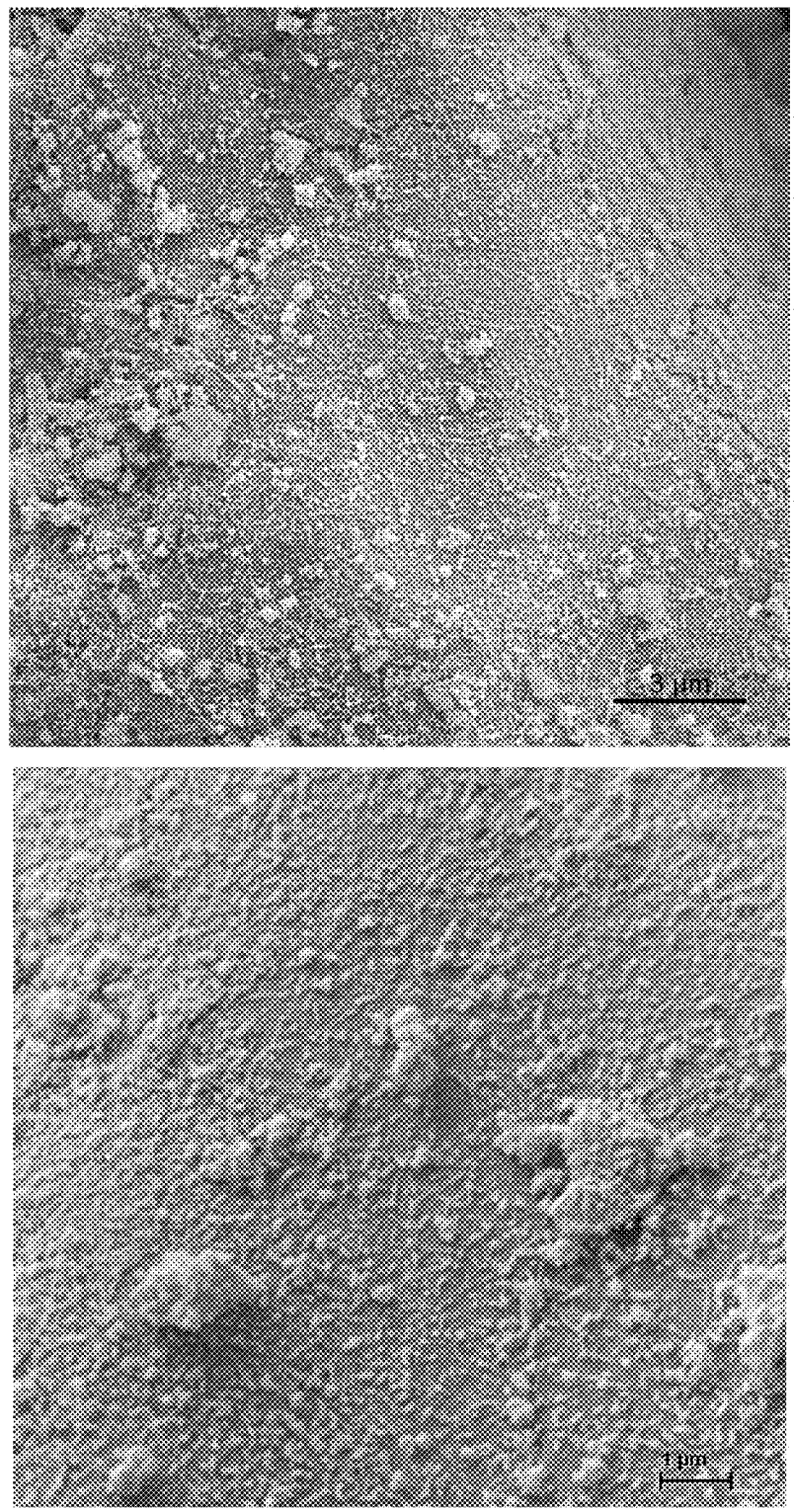
FIG. 2b includes magnified electron micrographs of the surface of the luminophore F-202 according to an exemplary embodiment of the present invention.

In FIG. 2a and FIG. 2b, electron micrographs of a fluorinated $Sr_3SiO_5:Eu$ luminophore according to exemplary embodiments of the present invention are compared to those of the untreated starting material. These micrographs demonstrate that the surface treatment, described in the working examples, with suitable fluorinating agents leads to the formation of specific surface structures, which can be visualized with the aid of scanning electron micrographs.

Figure 3:
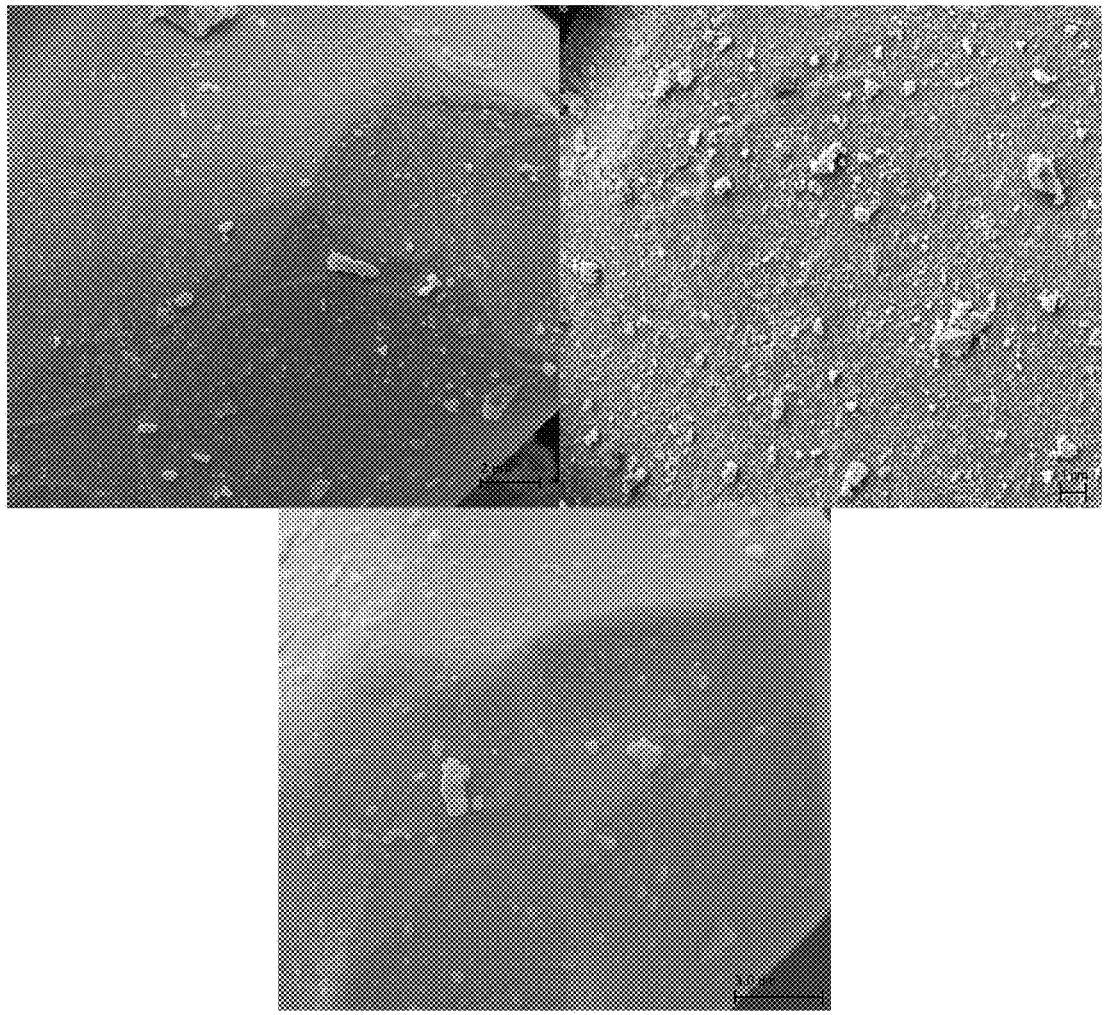
FIG. 3 are electron micrographs of uncoated, fluorinated, and $SiO_2$-coated alkaline earth metal orthosilicate luminophores of the base lattice composition $Sr_{0.876}Ba_{1.024}SiO_4$:$Eu_{0.1}$, showing a scanning electron micrograph of the uncoated starting material on the left, the fluorinated luminophore surface in the middle, and a luminophore sample additionally coated with $SiO_2$ on the right according to an exemplary embodiment of the present invention.

The situation is comparable for the electron micrographs shown in FIG. 3 for green-wavelength light-emitting alkaline earth metal orthosilicate luminophores. The micrographs in FIG. 3 show the characteristic particle surface of an untreated luminophore sample, that of the fluorinated material produced in accordance with the exemplary embodiments of the present invention, and that of a further sample derived from the starting material, which had additionally been coated with $SiO_2$.

Figure 4:
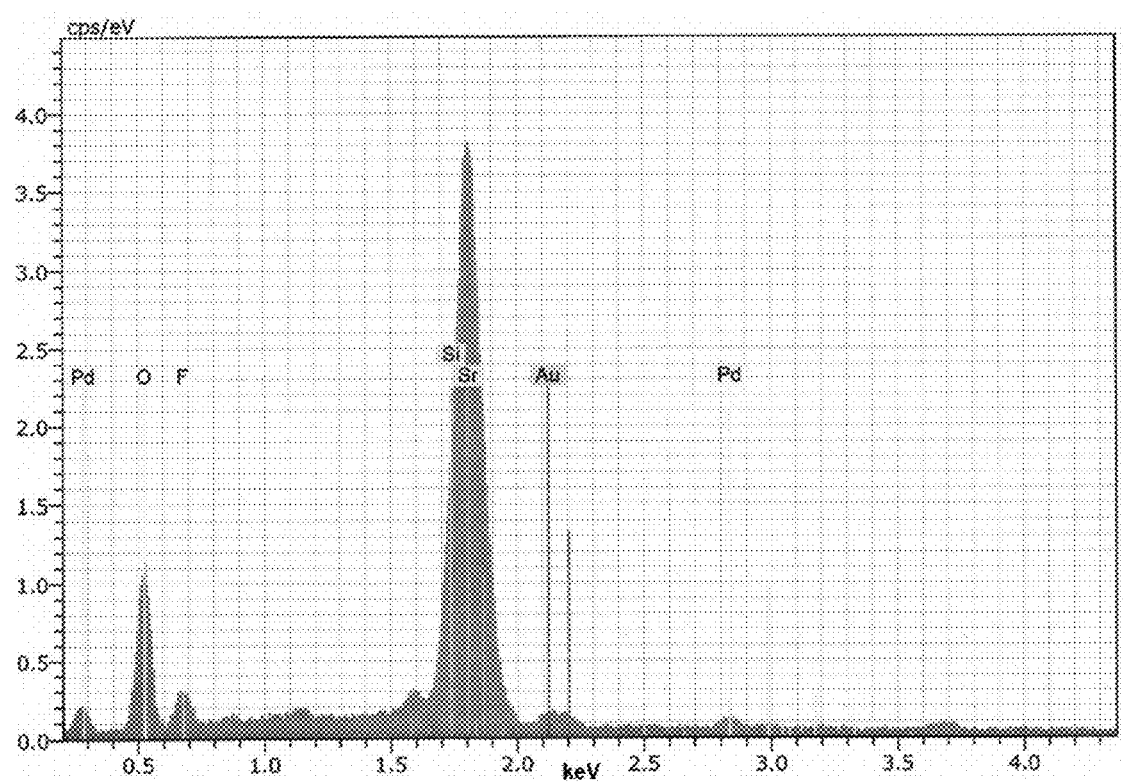
FIG. 4 is an energy-dispersive X-ray (EDX) spectroscopic image of the luminophore F-103 with manifested fluorinated surface structure according to an exemplary embodiment of the present invention.

At the same time, it becomes clear from the results of corresponding energy-dispersive X-ray spectroscopy (EDX) analyses shown in FIG. 4 that the surface structures contain fluorine. In addition to the peaks for strontium (Sr), silicon (Si) and oxygen (O), which are characteristic of the luminophore matrix, pronounced singular reflections with significant peak height are found in the EDX spectra of the luminophores fluorinated in accordance with the invention, which must be assigned unambiguously to the element fluorine (F) on the basis of the peak's energy position. In addition, the spectrum shown also contains reflections designated as gold (Au) and palladium (Pd), which result from coating the luminophore sample with gold and palladium for reasons related to analysis methodology.

Figure 5:
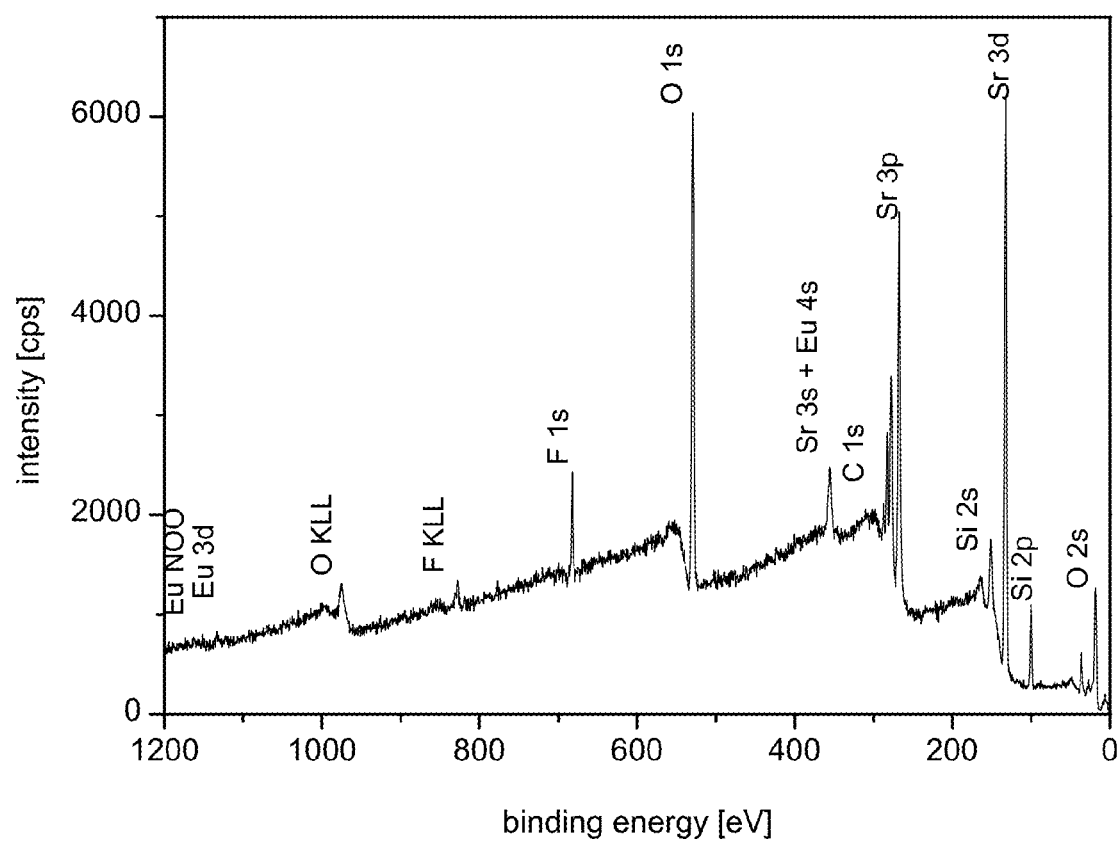
FIG. 5 is an X-ray photoelectron (XPS) spectrum of the luminophore F-103 according to an exemplary embodiment of the present invention.
Figure 6:
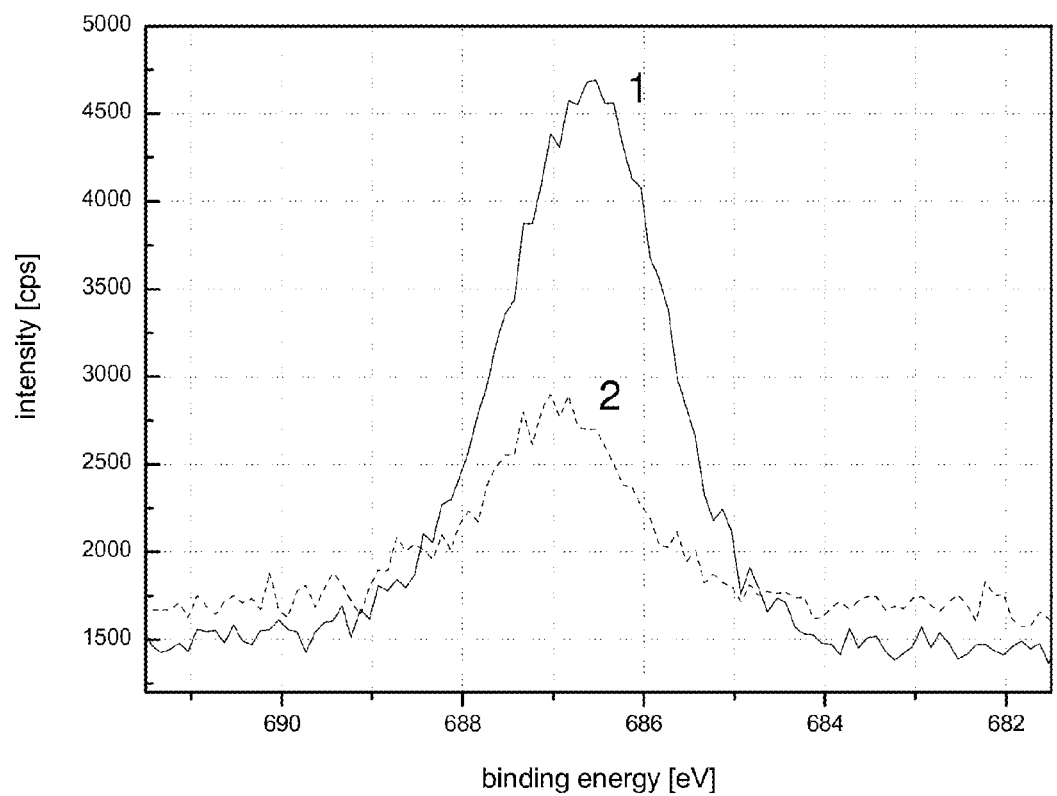
FIG. 6 is a graph showing representative fluorine XPS peaks for different luminophore samples. Curve 1 relates to the mechanical mixture of the luminophore having the composition $Sr_{2.9}Ba_{0.01}Ca_{0.05}Eu_{0.04}SiO_5$ with an amount of $NH_4F$ according to working example A1, and curve 2 relates to the fluorine is peak of the fluorinated luminophore F-103 according to an exemplary embodiment of the present invention.

Further evidence for the fixing of finely dispersed fluorides or of fluorine compounds or for the formation of networks of such compounds on the surface of the luminophores according to exemplary embodiments of the present invention is documented in FIG. 5 and FIG. 6 by the results of X-ray photoelectron spectroscopy (XPS) analyses. Fixing may include adsorption and like means for chemisorption or physisorption. The XPS spectrum, shown in FIG. 5, of a luminophore of base lattice composition $Sr_{2.9}Ba_{0.01}Ca_{0.05}Eu_{0.04}SiO_5$ treated with $NH_4F$ according to Working Example 1 shows that it is also possible with this solid-state analysis method to detect the element fluorine (F) as a constituent of the surface structures of the fluorinated luminophores. Further conclusions may also be drawn from the XPS spectrum. For example, it is evident from the comparison of the internally calibrated XPS spectra of the $NH_4F$-fluorinated oxyorthosilicate luminophore (curve 2 in FIG. 6) with that of a sample of a mechanical mixture of the corresponding luminophore matrix with an equivalent amount of $NH_4F$ (curve 1 of FIG. 6) that the F 1s peaks determined in each case have different intensities and also exhibit a shift in binding energy relative to one another as shown in FIG. 6.

The lower intensity of the F 1s peak of the sample labeled as curve 2 can be interpreted as loss of some of the added fluorine from the luminophore surface during processing. The shift in the F is peak to lower binding energies of curve 1 may indicate formation of a chemical bond between the applied fluorinating agent and the surface of the luminophore matrix.

In Table 1, Table 2, Table 3, Table 4, Table 5, and Table 6, several luminescence parameters of different silicatic luminophores configured in accordance with exemplary embodiments of the present invention and the results of the stability tests are compiled and compared with those of the unchanged (i.e., non-fluorinated surface) luminophore powders and in some cases with those of commercial comparative luminophores. Table 5 contains optical and stability data of fluorinated and of fluorinated and $SiO_2$-coated $Eu^{2+}$-coated strontium oxyorthosilicate luminophores. Table 6 contains optical and stability data of $SiO_2$-coated strontium oxyorthosilicate luminophores that have been fluorinated.

The moisture stability of the materials was assessed by storage of the corresponding luminophore samples in a climate-controlled cabinet, which was operated at a temperature of 85° C. and 85% air humidity, for seven days. Subsequently, the luminophores were dried at 150° C. for 24 hours and then subjected to a comparative measurement of the luminescence yield.

The results of the comparative luminescence measurements demonstrate that both the luminescence efficiencies of the luminophores according to exemplary embodiments of the present invention and the temperature dependencies thereof are equal to those of commercial europium-activated alkaline earth metal oxyorthosilicate or corresponding orthosilicate luminophores, or even exceed them. Secondly, the results of the stability tests show that the luminophores according to exemplary embodiments of the present invention with fluorinated surface structure and optional additional $SiO_2$ coating, as shown in Table 4, Table 5, and Table 6, have significantly improved moisture resistances compared to unchanged (i.e. non-fluorinated surface) luminophores of the same matrix composition.

As discussed above, silicate luminophores are surface modified with a coating including, for example, a fluorinated coating. However, the application of the fluorinated coating is not limited to the silicate luminophores. The fluorinated coating can also be applied to quantum dot luminophores. Semiconductor quantum dot luminophores convert high energy radiation into visible light, based on their band gap structure. In addition, quantum dot luminophores are very reactive due to their small size, and thus, quantum dots have also a comparatively low radiation stability and high sensitivity to water, air humidity, and other environmental factors.

Figure 7:
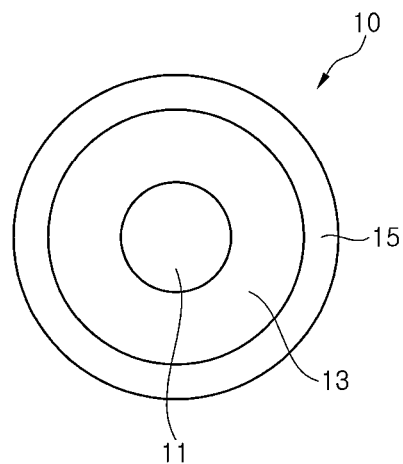
FIG. 7 depicts a sectional view of a surface modified quantum dot luminophore according to an embodiment of the present invention.
Figure 8:
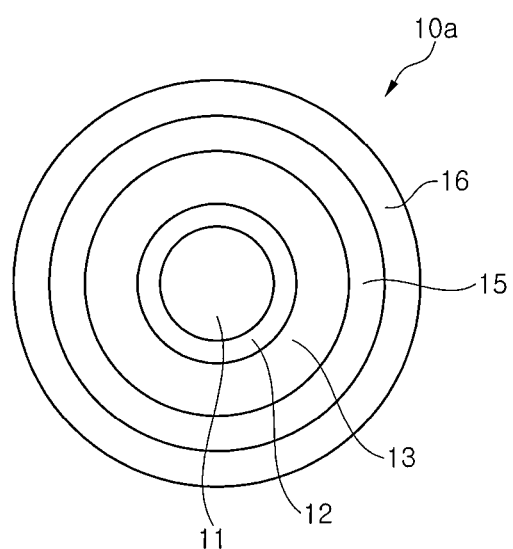
FIG. 8 depicts a sectional view of a surface modified quantum dot luminophore according to another embodiment of the present invention.

FIG. 7 and FIG. 8 depict sectional views of surface modified quantum dot (QD) luminophores 10 and 10a, according to exemplary embodiments of the present invention.

Referring to FIG. 7, the surface modified QD luminophore 10 comprises a QD luminophore 11 and a coating disposed on the surface of the QD luminophore 11. The coating may comprise a moisture barrier layer 13 and a fluorinated coating 15.

The QD luminophore 11 comprises a II-VI or III-V group compound semiconductor QD luminophore. The II-VI group compound semiconductor QD luminophore may comprise CdSe or CdS, and the III-V group compound semiconductor QD luminophore may comprise (Al, In, Ga)P, (Al, In, Ga)As, or (Al, In, Ga)N, but the invention is not limited thereto.

The moisture barrier layer 13 may comprise at least one of at least one inorganic material of $MgO$, $Al_2O_3$, $Y_2O_3$, $La_2O_3$, $Gd_2O_3$, $Lu_2O_3$, $SiO_2$, and the corresponding precursors, at least one semiconductor material layer having a bandgap wider than that of the QD luminophore, and at least one organic ligand of an amine, an acid and SH. The moisture barrier layer 13 may be a single layer or multi-layers formed of different ones of the above materials.

The inorganic materials are similar to the inorganic moisture barrier layer materials discussed in the previous embodiments, and detailed descriptions thereof are omitted. The moisture barrier layer 13 including the semiconductor material may be a shell surrounding the QD luminophore 11. The semiconductor material has a lattice mismatch with the QD luminophore 11. The larger the lattice mismatch therebetween, the higher the conversion efficiency of the surface modified luminophore 10. A buffer layer 12 may be applied between the QD luminophore 11 and the moisture barrier layer 13, as shown in FIG. 8. In the case of CdS or CdSe QD luminophore, the semiconductor material may be, for example, ZnS, and the buffer layer 12 may be ZnCdS or ZnCdSe. The moisture barrier layer 13 may also be formed to have the semiconductor material with the organic ligand of an amine, acid, or SH.

The fluorinated coating 15 is similar to the fluorinated coating described above in the previous embodiments. The fluorinated coating 15 may comprise a fluorinated inorganic agent, a fluorinated organic agent, or a combination of a fluorinated inorganic agent and a fluorinated organic agent. The fluorinated coating 15 generates hydrophobic surface sites.

The fluorinated coating 15 may comprise fluorine ions or fluorine compounds that are surface fixed or cross linked. An optional additional coating 16 including non-fluorinated layer-forming materials can be applied to the fluorinated coating, as shown in FIG. 8.

According to exemplary embodiments of the present invention, the QD luminophores may be fluorinated using fluorine-functionalized organosilanes having formula $Si(OR)_3X$, where $R=CH_3, C_2H_5, \ldots$, and $X=$ a F-functionalized organic ligand. Controlled hydrolysis and condensation may achieve the formation of a fluorinated barrier layer on a QD luminophore matrix, which may be a barrier and may also have hydrophobic properties. In addition, the moisture barrier layer 13 may be formed on the QD luminophore before forming the fluorinated barrier layer thereon.

The fluorination of the surfaces of the QD luminophores is similar to the fluorination of the surfaces of the pulverulent alkaline earth metal silicate luminophores. However, the moisture barrier layer 13 may be formed before the fluorination of the surfaces of the QD luminophores, in order to prevent surface reactions of the QD luminophores.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

TABLE 1

| Composition of the luminophore matrix | Sample No. | Fluorinating agent | Proportion [%] | Intensity L [%] | Color coordinates x | Color coordinates y | Half-height width [nm] | Intensity at 150° C. $I_{150}/I_{25}$ [%] | Intensity after climate-controlled chamber test $I_{before}/I_{after}$ [%] |
|---|---|---|---|---|---|---|---|---|---|
| $Sr_3SiO_5$:Eu | commercial | | | 97.6 | 0.5420 | 0.4560 | 68.8 | 91.3 | 71.7 |
| $Sr_{2.9}Ba_{0.01}Ca_{0.05}Eu_{0.04}SiO_5$ | Starting material for fluorination tests | | | 100 | 0.5462 | 0.4518 | 71.0 | 92.7 | 92.3 |
| | F-100 | $NH_4F$ | 2.5 | 99.1 | 0.5459 | 0.4522 | 70.6 | 92.4 | 93.4 |
| | F-101 | $NH_4F$ | 5 | | | | | | |
| | F-102 | $NH_4F$ | 7.5 | | | | | | |
| | F-103 | $NH_4F$ | 10 | | | | | | |
| additionally heat-treated samples (1 hour, 400° C., 35% $H_2$) | | | | | | | | | |
| | F-100T | $NH_4F$ | 2.5 | 97.3 | 0.5457 | 0.4524 | 70.7 | 92.1 | 93.1 |
| | F-101T | $NH_4F$ | 5 | 98.3 | 0.5453 | 0.4527 | 70.9 | 92.8 | 94.7 |
| | F-102T | $NH_4F$ | 7.5 | 97.2 | 0.5454 | 0.4525 | 71.1 | 92.3 | 103.7 |
| | F-103T | $NH_4F$ | 10 | 98.3 | 0.5456 | 0.4525 | 70.9 | 92.7 | 102.3 |

TABLE 2

| Composition of the luminophore matrix | Sample No. | Fluorinating agent | Proportion [%] | Intensity L [%] | Color coordinates x | Color coordinates y | Half-height width [nm] | Intensity at 150° C. $I_{150}/I_{25}$ [%] | Intensity after climate-controlled chamber test $I_{before}/I_{after}$ [%] |
|---|---|---|---|---|---|---|---|---|---|
| $Sr_3SiO_5$:Eu | commercial | | | 97.6 | 0.5420 | 0.4560 | 68.8 | 91.3 | 71.7 |
| $Sr_{2.9}Ba_{0.01}Ca_{0.05}Eu_{0.04}SiO_5$ | Starting material for fluorination tests | | | 100 | 0.5462 | 0.4518 | 71.0 | 92.7 | 92.3 |
| | F-200 | $NH_4HF_2$ | 2.5 | 98.8 | 0.5459 | 0.4521 | 70.6 | 93.1 | 93.4 |
| | F-201 | $NH_4HF_2$ | 5 | 99.2 | 0.5455 | 0.4525 | 70.9 | 92.6 | 94.9 |
| | F-202 | $NH_4HF_2$ | 7.5 | 99.4 | 0.5459 | 0.4521 | 70.8 | 91.9 | 98.7 |
| | F-203 | $NH_4HF_2$ | 10 | 98.8 | 0.5457 | 0.4522 | 70.9 | 92.3 | 98.9 |
| additionally heat-treated samples (1 h, 400° C., 35% $H_2$) | | | | | | | | | |
| | F-200T | $NH_4HF_2$ | 2.5 | 97.3 | 0.5458 | 0.4523 | 70.6 | 92.7 | 103.3 |
| | F-201T | $NH_4HF_2$ | 5 | 98.3 | 0.5456 | 0.4525 | 71.1 | 92.1 | 102.6 |
| | F-202T | $NH_4HF_2$ | 7.5 | 97.2 | 0.5454 | 0.4520 | 71.1 | 92.1 | 102.7 |
| | F-203T | $NH_4HF_2$ | 10 | 98.3 | 0.5455 | 0.4526 | 70.9 | 92.5 | 102.0 |

TABLE 3

| Composition of the luminophore matrix | Sample No. | Fluorinating agent | Proportion [%] | Intensity L [%] | Color coordinates x | Color coordinates y | Intensity after climate-controlled chamber test $I_{before}/I_{after}$ [%] |
|---|---|---|---|---|---|---|---|
| $Sr_3SiO_5$:Eu | commercial | | | 97.6 | 0.5420 | 0.4560 | 71.7 |
| $Sr_{2.9485}Ba_{0.01}Cu_{0.0015}Eu_{0.04}SiO_5$ | Starting material for | | | 100 | | | 83.6 |

TABLE 3-continued

| Composition of the luminophore matrix | Sample No. | Fluorinating agent | Proportion [%] | Intensity L [%] | Color coordinates x | Color coordinates y | Intensity after climate-controlled chamber test $I_{before}/I_{after}$ [%] |
|---|---|---|---|---|---|---|---|
| | fluorination tests | | | | | | |
| | F-300 | LiF | 5 | 99.1 | 0.5373 | 0.4604 | 93.3 |
| | F-301 | + | 10 | 98.5 | 0.5381 | 0.4598 | 91.9 |
| | F-310 | $BaF_2$ | 1 | 97.8 | 0.5374 | 0.4598 | 93.6 |
| | F-311 | + | 5 | 98.2 | 0.5380 | 0.4521 | 89.0 |
| | F-320 | $AlF_3$ | 5 | 98.8 | 0.5371 | 0.4606 | 99.2 |
| | F-321 | + | 10 | 98.2 | 0.5407 | 0.4572 | 94.2 |
| | additionally heat-treated samples (1 h, 400° C., 35% $H_2$) | | | | | | |
| | F-300T | LiF | 5 | 99.0 | 0.5372 | 0.4505 | 95.1 |
| | F-310T | $BaF_2$ | 1 | 98.0 | 0.5371 | 0.4607 | 95.7 |
| | F-320T | $AlF_3$ | 5 | 99.1 | 0.5368 | 0.4608 | 99.4 |

TABLE 4

| Composition of the luminophore matrix | Sample No. | Fluorination | Proportion [%] | Coating | Intensity L [%] | Color coordinates x | Color coordinates y | Intensity after climate-controlled chamber test $I_{before}/I_{after}$ [%] |
|---|---|---|---|---|---|---|---|---|
| $Sr_{0.876}Ba_{1.024}Eu_{0.1}SiO_4$ | Starting material for fluorination tests | | | | 100 | 0.2943 | 0.6298 | 83.6 |
| | F-400 | $NH_4F$ | 10 | — | 99.5 | 0.2938 | 0.6300 | 97.9 |
| | F-400TS | $NH_4F$ | 10 | TEOS | 99.1 | 0.2933 | 0.6294 | 98.9 |
| | F-401 | $NH_4F$ | 20 | — | 99.8 | 0.2942 | 0.6297 | 96.6 |
| | F-401TS | $NH_4F$ | 20 | TEOS | 100.7 | 0.2935 | 0.6298 | 98.7 |
| | F-402 | $NH_4FHF_2$ | 10 | — | 99.2 | 0.2938 | 0.6299 | 98.2 |
| | F-402TS | $NH_4FHF_2$ | 10 | TEOS | 100.4 | 0.2932 | 0.6302 | 99.5 |
| | F-403 | $NH_4FHF_2$ | 20 | — | 100.0 | 0.2941 | 0.6302 | 99.7 |
| | F-403TS | $NH_4FHF_2$ | 20 | TEOS | 101.4 | 0.2940 | 0.6307 | 100.1 |

TABLE 5

| Luminophore composition | Sample No. | Fluorination | Proportion [%] | Coating | Intensity L [%] | Color coordinates x | Color coordinates y | Intensity after climate-controlled chamber test $I_{before}/I_{after}$ [%] |
|---|---|---|---|---|---|---|---|---|
| $Sr_{2.935}Ba_{0.015}Eu_{0.05}SiO_5$ | | | | | 98.2 | 0.5422 | 0.4565 | 72.3 |
| | | | | | 100 | 0.5386 | 0.4592 | 78.4 |
| | F-500 | $NH_4F$ | 10 | — | 98.0 | 0.5383 | 0.4594 | 91.6 |
| | F-500TS | $NH_4F$ | 10 | TEOS | 93.9 | 0.5372 | 0.4604 | 101.1 |
| | F-501 | $NH_4F$ | 20 | — | 97.2 | 0.5382 | 0.4594 | 97.1 |
| | F-501TS | $NH_4F$ | 20 | TEOS | 93.3 | 0.5372 | 0.4605 | 101.5 |
| | F-502 | $NH_4HF_2$ | 10 | — | 97.8 | 0.5387 | 0.4591 | 97.3 |
| | F-502TS | $NH_4HF_2$ | 10 | TEOS | 93.2 | 0.5374 | 0.4601 | 101.8 |
| | F-503 | $NH_4HF_2$ | 20 | — | 95.1 | 0.5383 | 0.4595 | 99.5 |
| | F-503TS | $NH_4HF_2$ | 20 | TEOS | 93.0 | 0.5376 | 0.4699 | 100.7 |

TABLE 6

| Luminophore composition | Sample No. | Coating | Fluorination | Proportion [%] | Intensity L [%] | Color coordinates x | Color coordinates y | Intensity after climate-controlled chamber test $I_{before}/I_{after}$ [%] |
|---|---|---|---|---|---|---|---|---|
| $Sr_3SiO_5:Eu$ | commercial | | | | 98.3 | 0.5319 | 0.4563 | 69.3 |
| $Sr_{2.948}Ba_{0.01}Cu_{0.002}Eu_{0.04}SiO_5$ | Original | | | | 100 | 0.5462 | 0.4514 | 92.0 |
| | TS-600 | TEOS | — | | 101.7 | 0.5465 | 0.4515 | 96.8 |
| | F-TS-600 | TEOS | $NH_4F$ | 20 | 100.6 | 0.5458 | 0.4522 | 102.7 |
| | TS-601 | TEOS | — | | 98.5 | 0.5456 | 0.4523 | 98.4 |
| | F-TS-601 | TEOS | $NH_4F$ | 20 | 97.6 | 0.5452 | 0.4528 | 103.4 |

What is claimed is:

1. A surface-modified quantum dot (QD) luminophore, comprising:
   a QD luminophore; and
   a fluorinated coating disposed on the QD luminophore and comprising a fluorine-functionalized organosilane having the general formula $Si(OR)_3X$,
   wherein R is an alkyl group having one or two carbon atoms, and X is a fluorine-functionalized organic ligand, the fluorinated coating configured to generate hydrophobic surface sites.

2. The surface-modified QD luminophore of claim 1, wherein the QD luminophore comprises a II-VI group compound semiconductor or a III-V group compound semiconductor.

3. The surface-modified QD luminophore of claim 2, wherein:
   the II-VI group compound semiconductor comprises CdSe or CdS; and
   the III-V group compound semiconductor comprises (Al, In, Ga)P, (Al, In, Ga)As, or (Al, In, Ga)N.

4. The surface-modified QD luminophore of claim 1, wherein the fluorinated coating comprises a surface fixed or cross-linked fluorine ion, or surface fixed or cross-linked fluorine compound.

5. The surface-modified QD luminophore of claim 1, further comprising a moisture barrier layer disposed between the QD luminophore and the fluorinated coating, the moisture barrier layer comprising at least one of:
   at least one inorganic material selected from MgO, $Al_2O_3$, $Y_2O_3$, $La_2O_3$, $Gd_2O_3$, $Lu_2O_3$, $SiO_2$, and corresponding precursors thereof;
   at least one semiconductor material having a bandgap wider than that of the QD luminophore; and
   at least one organic ligand of an amine, an acid, and SH.

6. The surface-modified QD luminophore of claim 5, wherein the semiconductor material has a lattice mismatch with the QD luminophore and surrounds the QD luminophore.

* * * * *